(12) United States Patent
Ishimoto

(10) Patent No.: US 12,531,523 B2
(45) Date of Patent: Jan. 20, 2026

(54) CURRENT CONTROL CIRCUIT, BIAS SUPPLY CIRCUIT, AND AMPLIFIER DEVICE

(71) Applicant: Murata Manufacturing Co., Ltd., Kyoto (JP)

(72) Inventor: Kazuhiko Ishimoto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 501 days.

(21) Appl. No.: 18/182,661

(22) Filed: Mar. 13, 2023

(65) Prior Publication Data

US 2023/0216454 A1    Jul. 6, 2023

Related U.S. Application Data

(63) Continuation of application No. PCT/JP2021/032735, filed on Sep. 6, 2021.

(30) Foreign Application Priority Data

Sep. 14, 2020 (JP) ................. 2020-153774

(51) Int. Cl.
*H03F 3/21* (2006.01)
*H03F 1/02* (2006.01)
*H03F 3/193* (2006.01)

(52) U.S. Cl.
CPC ......... *H03F 3/1935* (2013.01); *H03F 1/0216* (2013.01); *H03F 3/21* (2013.01); *H03F 2200/451* (2013.01)

(58) Field of Classification Search
CPC .......... H03F 3/1935; H03F 3/21; H03F 3/195; H03F 3/245; H03F 1/0216; H03F 1/0261; H03F 1/30; H03F 2200/451; H03F 2200/18; H03F 2200/447
USPC ......................................... 330/296, 285, 289
See application file for complete search history.

(56) References Cited

U.S. PATENT DOCUMENTS

2005/0179484 A1  8/2005 Sasho et al.
2019/0280658 A1* 9/2019 Morisawa ............... H03F 1/523

FOREIGN PATENT DOCUMENTS

JP    2005-228196 A    8/2005
JP    2010-056606 A    3/2010

OTHER PUBLICATIONS

International Search Report for PCT/JP2021/032735 dated Nov. 22, 2021.

* cited by examiner

*Primary Examiner* — Andrea Lindgren Baltzell
*Assistant Examiner* — Nareh Shamiryan
(74) *Attorney, Agent, or Firm* — McDonald Hopkins LLC

(57) ABSTRACT

A current control circuit controls a bias current that is supplied to an amplifier transistor that amplifies a radio-frequency signal and includes a node, a constant current source circuit that supplies a first current to the node, and a variable current source circuit that supplies a second current to the node, based on a result of comparison between a potential of the node and a reference potential. The node outputs a control current including the first current and the second current for controlling the bias current.

18 Claims, 8 Drawing Sheets

CURRENT CONTROL CIRCUIT, BIAS SUPPLY CIRCUIT, AND AMPLIFIER DEVICE

CROSS REFERENCE TO RELATED APPLICATION

This is a continuation of International Application No. PCT/JP2021/032735 filed on Sep. 6, 2021 which claims priority from Japanese Patent Application No. 2020-153774 filed on Sep. 14, 2020. The contents of these applications are incorporated herein by reference in their entireties.

BACKGROUND ART

Technical Field

The present disclosure relates to a current control circuit, a bias supply circuit, and an amplifier device.

A known radio-frequency amplifier circuit amplifies a radio-frequency signal. Patent Document 1, for example, discloses a radio-frequency amplifier circuit that includes an amplifier transistor and a bias voltage supply circuit that supplies a bias to the amplifier transistor.

Patent Document 1: Japanese Unexamined Patent Application Publication No. 2005-228196

BRIEF SUMMARY

As for the known radio-frequency amplifier circuit described above, a bias current that is supplied to the base of the amplifier transistor decreases due to an inputted high-voltage signal or an influence of heat generation from the amplifier transistor, and the gain of the amplifier transistor consequently decreases. As a result, the amplifier transistor cannot maintain the linearity of input power, and output distortion increases.

The present disclosure provides a current control circuit, a bias supply circuit, and an amplifier device that can inhibit distortion characteristics of an amplifier transistor from being degraded.

A current control circuit according to an aspect of the present disclosure is a current control circuit for controlling a bias current that is supplied to an amplifier transistor that amplifies a radio-frequency signal. The current control circuit includes a first node, a first constant current source circuit that supplies a first current to the first node, and a variable current source circuit that supplies a second current to the first node, based on a result of comparison between a potential of the first node and a reference potential. The first node outputs a control current including the first current and the second current for controlling the bias current.

A bias supply circuit according to an aspect of the present disclosure includes the current control circuit according to the aspect described above, and a bias circuit that is connected to the first node and that supplies the bias current to the amplifier transistor. The bias circuit includes a second current mirror circuit that includes a fifth transistor and a sixth transistor that include respective control terminals connected to each other. A first input-output terminal and the control terminal of the fifth transistor are connected to the first node. A first input-output terminal of the sixth transistor is connected to a control terminal of the amplifier transistor.

An amplifier device according to an aspect of the present disclosure includes the bias supply circuit according to the aspect described above and the amplifier transistor.

According to the present disclosure, distortion characteristics of an amplifier transistor can be inhibited from being degraded.

DETAILED DESCRIPTION

Figure 1:
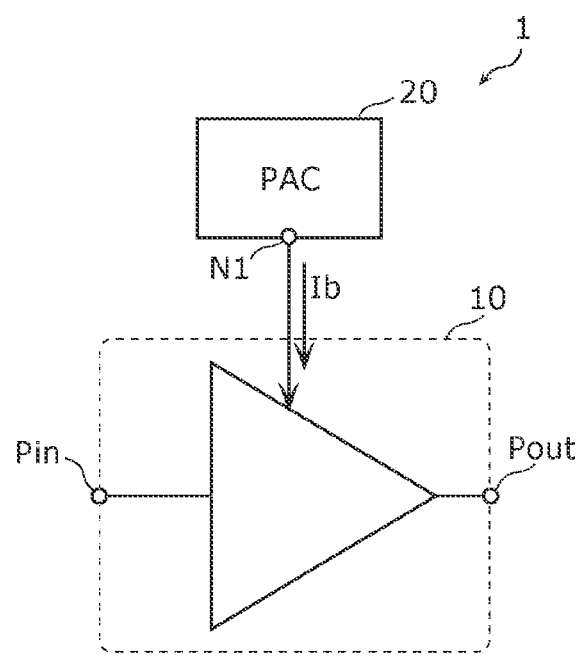
FIG. 1 illustrates the structure of an amplifier device according to a first embodiment.

Current control circuits, bias supply circuits, and amplifier devices according to embodiments of the present disclosure will hereinafter be described in detail with reference to the drawings. The embodiments described below are specific examples of the present disclosure. Accordingly, numerical values, shapes, materials, components, the arrangement and connection form of the components, steps, and the order of the steps, for example, are described by way of example according to the embodiments below and do not limit the present disclosure. For this reason, components that are not recited in the independent claim among the components according to the embodiments below are described as optional components.

The drawings are schematically illustrated and are not necessarily illustrated strictly. Accordingly, the reduced scales of the drawings, for example, are not necessarily the same. In the drawings, components having substantially the same structure are designated by like reference signs, and a duplicated description is omitted or simplified.

As for a circuit structure according to the present disclosure, the expression "directly connected" means direct connection by using a connection terminal and/or a wiring conductor without necessarily interposing another circuit element therebetween. The case of "being connected" includes not only the case of being directly connected by using a connection terminal and/or a wiring conductor but also the case of being electrically connected with another circuit element interposed therebetween. The expression "connected between A and B" means being connected to both of A and B between A and B.

In the present specification, ordinal numbers such as "first", "second", and so on do not mean the order or number of the components but are used to distinguish the same kind of components without necessarily confusion unless otherwise particularly described.

First Embodiment

[1-1. Structure of Amplifier Device]

Firstly, an amplifier device according to a first embodiment will be described with reference to FIG. 1. FIG. 1 illustrates the structure of an amplifier device 1 according to the present embodiment.

As illustrated in FIG. 1, the amplifier device 1 includes a power amplifier 10 and a current control circuit 20.

The power amplifier 10 includes an input terminal Pin and an output terminal Pout. The input terminal Pin is connected to, for example, a RFIC (Radio Frequency Integrated Circuit). The output terminal Pout is connected to, for example, an antenna element (not illustrated).

The power amplifier 10 amplifies a radio-frequency signal that is inputted from the input terminal Pin and outputs the amplified radio-frequency signal from the output terminal Pout. The radio-frequency signal conforms to a communication standard, such as Wi-Fi (registered trademark), LTE (Long Term Evolution), or 5G (5th Generation). The power amplifier 10 amplifies the radio-frequency signal for transmission. The power amplifier 10 is disposed, for example, at a front-end portion of a cellular phone that supports a multi-mode/multi-band.

The current control circuit 20 controls a bias current Ibpa that is supplied to an amplifier transistor 11 (see FIG. 2) that is included in the power amplifier 10. Specifically, the current control circuit 20 supplies a control current Ib that is outputted from a node N1 to the power amplifier 10. The control current Ib is a current for controlling the bias current Ibpa of the amplifier transistor 11. A relationship between the control current Ib and the bias current Ibpa will be described later. The current control circuit 20 is also called a PAC (Power Amplifier Controller) and controls the operation of the power amplifier 10 by controlling the bias current Ibpa.

[1-2. Structure of Power Amplifier]

Figure 2:
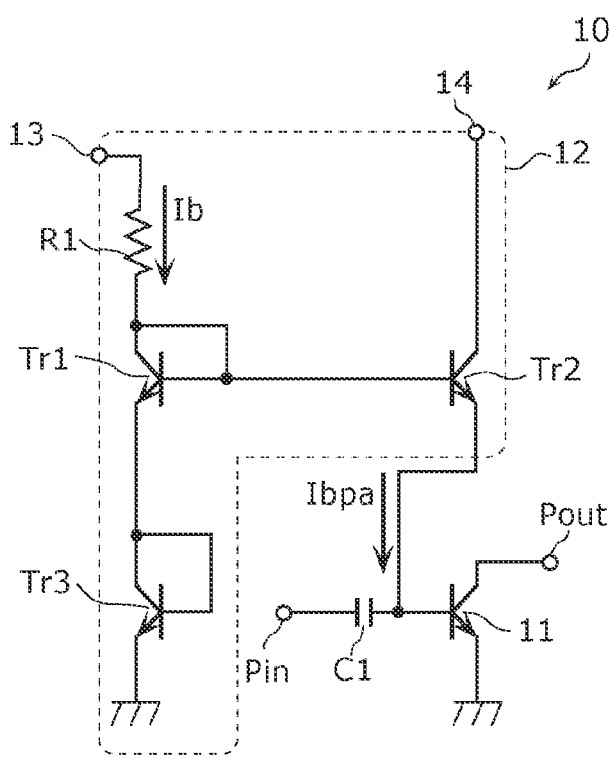
FIG. 2 is a circuit diagram illustrating the circuit structure of the power amplifier according to the first embodiment.

Next, the structure of the power amplifier 10 will be described with reference to FIG. 2. FIG. 2 is a circuit diagram illustrating the circuit structure of the power amplifier 10 according to the present embodiment.

As illustrated in FIG. 2, the power amplifier 10 includes the amplifier transistor 11, a bias circuit 12, and a capacitor C1 for DC cutting.

The amplifier transistor 11 amplifies the inputted radio-frequency signal. The amplifier transistor 11 is a bipolar transistor and includes a base, a collector, and an emitter. An example of the amplifier transistor 11 is a npn bipolar transistor that is formed by using, for example, silicon (Si), silicon germanium (SiGe), or gallium arsenide (GaAs).

The base of the amplifier transistor 11 is an example of a control terminal and is connected to the input terminal Pin with the capacitor C1 for DC cutting interposed therebetween. The collector of the amplifier transistor 11 is connected to the output terminal Pout. The emitter of the amplifier transistor 11 is connected (that is, grounded) to the ground.

The power amplifier 10 may include multiple amplifier transistors 11. The multiple amplifier transistors 11 may form a multi-cell bipolar transistor.

The bias circuit 12 supplies the bias current Ibpa to the amplifier transistor 11. The bias circuit 12 is connected to the node N1 of the current control circuit 20. Specifically, the bias circuit 12 includes a control input terminal 13 and a power terminal 14. The control input terminal 13 is connected to the node N1.

As illustrated in FIG. 2, the bias circuit 12 includes transistors Tr1, Tr2, and Tr3 and a resistor R1.

The transistors Tr1 and Tr2 include respective control terminals connected to each other and form a current mirror circuit. The current mirror circuit is an example of a second current mirror circuit and is connected to the amplifier transistor 11. The kinds of the transistors Tr1 and Tr2 are the same. Specifically, each of the transistors Tr1 and Tr2 is a bipolar transistor and includes a base, a collector, and an emitter. The base is an example of the control terminal. The collector and the emitter are examples of an input-output terminal. Examples of the transistors Tr1 and Tr2 include a npn bipolar transistor that is formed by using Si, SiGe, or GaAs.

The transistor Tr1 is an example of a fifth transistor. The collector and the base of the transistor Tr1 are connected to each other and is connected to the control input terminal 13 with the resistor R1 interposed therebetween. That is, the collector and the base of the transistor Tr1 are connected to the node N1 of the current control circuit 20. The emitter of the transistor Tr1 is connected to the ground with the transistor Tr3 interposed therebetween.

The transistor Tr2 is an example of a sixth transistor. The collector of the transistor Tr2 is connected to the power terminal 14. The base of the transistor Tr2 is connected to the base of the transistor Tr1. The emitter of the transistor Tr2 is connected to the base of the amplifier transistor 11. For example, the emitter of the transistor Tr2 may be directly connected to the base of the amplifier transistor 11 or may be connected with a circuit element such as an inductor interposed therebetween.

The kind of the transistor Tr3 is the same as the kind of the amplifier transistor 11. The transistor Tr3 is a bipolar transistor and includes a base, a collector, and an emitter. An example of the transistor Tr3 is a npn bipolar transistor that is formed by Si, SiGe, or GaAs.

The transistor Tr3 is an example of a tenth transistor and is diode-connected between the emitter of the transistor Tr1 and a standard potential. Specifically, the base and the collector of the transistor Tr3 are connected to each other and are connected to the emitter of the transistor Tr1. The emitter of the transistor Tr3 is connected to the ground that is an example of the standard potential.

[1-3. Structure of Current Control Circuit]

Next, the structure of the current control circuit 20 will be described.

[1-3-1. Functional Configuration]

Figure 3:
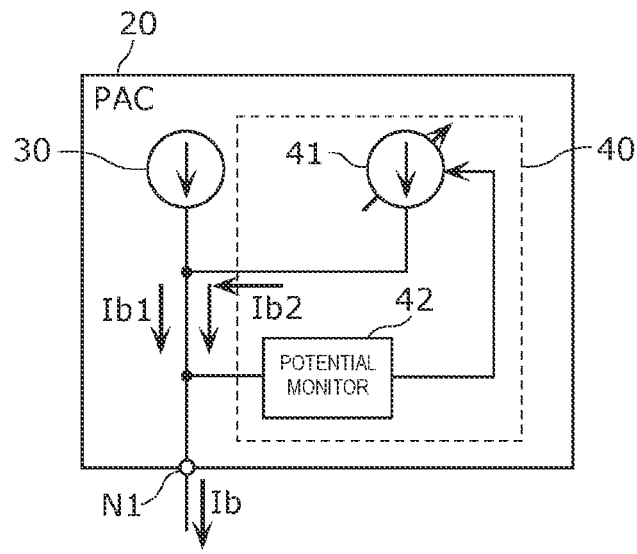
FIG. 3 illustrates the functional configuration of a current control circuit according to the first embodiment.

The functional configuration of the current control circuit 20 will now be described with reference to FIG. 3. FIG. 3 illustrates the functional configuration of the current control circuit 20 according to the present embodiment.

As illustrated in FIG. 3, the current control circuit 20 includes the node N1, a constant current source circuit 30, and a variable current source circuit 40.

The constant current source circuit 30 is an example of a first constant current source circuit and supplies a first current Ib1 to the node N1. The first current Ib1 is a constant current.

The variable current source circuit 40 supplies a second current Ib2 to the node N1, based on the result of comparison between the potential of the node N1 and a reference potential. The second current Ib2 is a variable current the intensity of which changes based on the result of comparison. Specifically, the variable current source circuit 40 increases the second current Ib2 in the case where the potential of the node N1 decreases and decreases the second current Ib2 in the case where the potential of the node N1 increases.

The node N1 is an example of a first node and is connected to the bias circuit 12 of the power amplifier 10. The node N1 is located on a path that connects the constant current source circuit 30 and the bias circuit 12 to each other. The node N1 is an output terminal that outputs the control current Ib. The control current Ib is a current for controlling the bias current Ibpa. The control current Ib includes the first current Ib1 and the second current Ib2. That is, the amount of the control current Ib is equal to the sum of the amount of the first current Ib1 and the amount of the second current Ib2.

As illustrated in FIG. 3, the function of the variable current source circuit 40 includes those of a variable current source 41 and a potential monitor 42.

The variable current source 41 generates and outputs the second current Ib2. Specifically, the variable current source 41 generates and outputs the second current Ib2 the intensity of which changes based on the result of monitoring (specifically, the result of comparison between the potentials) with the potential monitor 42.

The potential monitor 42 monitors the potential of the node N1. The potential monitor 42 compares the potential of the node N1 and the reference potential and controls the variable current source 41, based on the result of comparison. According to the present embodiment, the reference potential is equal to the potential of the node N1 with predetermined timing. That is, the reference potential is equal to the potential of the node N1 before timing with which the potential is monitored.

Specifically, the reference potential is equal to the potential of the node N1 in the case where the signal intensity of the radio-frequency signal that is inputted into the input terminal Pin of the power amplifier 10 is a threshold or less. The reference potential may be equal to the potential of the node N1 in the case where the temperature of the amplifier transistor 11 is a threshold or less. The reference potential may be equal to the potential of the node N1 in the case where the signal intensity of the radio-frequency signal is a threshold or less, and the temperature of the amplifier transistor 11 is a threshold or less. For example, the thresholds are equal to the signal intensity of the radio-frequency signal and the temperature of the amplifier transistor 11 when the appropriate bias current Ibpa flows through the amplifier transistor 11 in the case where the variable current source circuit 40 does not supply the second current Ib2, and only the first current Ib1 that is supplied from the constant current source circuit 30 is supplied as the control current Ib to the bias circuit 12. It is optional to limit the thresholds thereto.

In the case where the potential of the node N1 is less than the reference potential, the variable current source circuit 40 supplies, to the node N1, the second current Ib2 the intensity of which depends on a potential difference between the potential of the node N1 and the reference potential. In this case, a current including the first current Ib1 and the second current Ib2 is outputted as the control current Ib from the node N1 and is supplied to the bias circuit 12.

The variable current source circuit 40 does not supply the second current Ib2 in the case where the potential of the node N1 is equal to or more than the reference potential. That is, the first current Ib1 is outputted as the control current Ib from the node N1 and is supplied to the bias circuit 12.

[1-3-2. Circuit Structure]

Figure 4:
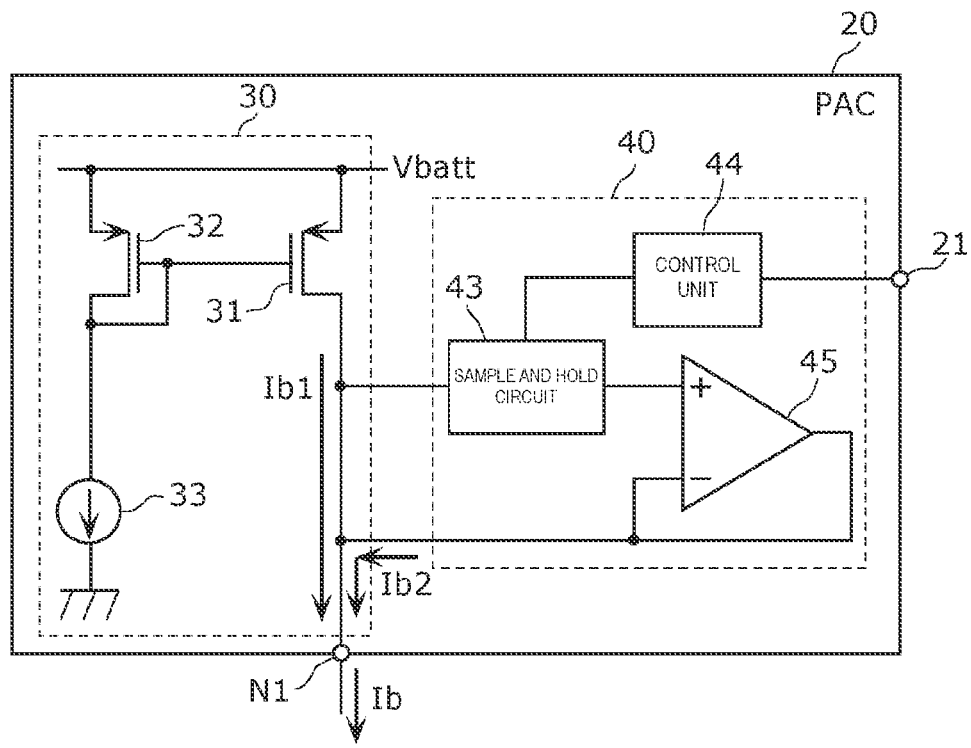
FIG. 4 is a circuit diagram illustrating the circuit structure of the current control circuit according to the first embodiment.

Next, a specific circuit structure of the current control circuit 20 will be described with reference to FIG. 4. FIG. 4 is a circuit diagram illustrating the circuit structure of the current control circuit 20 according to the present embodiment.

[1-3-2-1. Constant Current Source Circuit]

As illustrated in FIG. 4, the constant current source circuit 30 includes transistors 31 and 32 and a constant current source 33. The constant current source circuit 30 supplies, as the first current Ib1 to the node N1, a current that has an intensity equal to that of a constant current that is outputted from the constant current source 33 or an intensity in proportion to the intensity of the constant current.

The transistors 31 and 32 include respective control terminals connected to each other and form a current mirror circuit. The current mirror circuit is an example of a first current mirror circuit and is connected to the constant current source 33 and the node N1.

The kinds of the transistors 31 and 32 are the same. Specifically, each of the transistors 31 and 32 is a field-effect transistor and includes a gate, a drain, and a source. The gate is an example of the control terminal. The drain and the source are examples of the input-output terminal. Examples of the transistors 31 and 32 include a p-channel MOSFET (Metal Oxide Semiconductor Field Effect Transistor) that is formed by using Si.

The transistor 31 is an example of a first transistor. The source of the transistor 31 is connected to a voltage source Vbatt, and the drain thereof is connected to the node N1. The gate of the transistor 31 is connected to the constant current source 33.

The transistor 32 is an example of a second transistor. The source of the transistor 32 is connected to the voltage source Vbatt. The drain and the gate of the transistor 32 are connected to the constant current source 33.

The constant current source 33 outputs a constant current. Examples of the constant current source 33 include a current output DAC (Digital to Analog Converter) and a voltage-current conversion circuit. The constant current source 33 may include a circuit that converts detected input power or output power into a voltage in addition to the voltage-current conversion circuit. A current into which the voltage-current conversion circuit converts the voltage that is converted by the circuit may be outputted. The constant current source 33 may output the constant current by converting heat into the current.

A MOSFET that is formed by the current mirror circuit of the constant current source circuit 30 enables the current mirror circuit to operate under gate voltage control. This enables power consumption to be reduced. In addition, the current that is outputted from the constant current source 33 can be precisely converted into the first current Ib1.

[1-3-2-2. Variable Current Source Circuit]

As illustrated in FIG. 4, the variable current source circuit 40 includes a sample and hold circuit 43, a control unit 44, and an operational amplifier 45. The function of the variable current source 41 illustrated in FIG. 3 is fulfilled by the operational amplifier 45. The function of the potential monitor 42 illustrated in FIG. 3 is fulfilled by the sample and hold circuit 43, the control unit 44, and the operational amplifier 45. That is, the operational amplifier 45 serves at least parts of the functions of the variable current source 41 and the potential monitor 42.

The sample and hold circuit 43 is an example of a hold circuit that holds the reference potential.

Specifically, the sample and hold circuit 43 holds the potential of the node N1 with the predetermined timing as the reference potential. According to the present embodiment, the sample and hold circuit 43 is directly connected to the node N1.

For example, the sample and hold circuit 43 includes a capacitor and a switch that switches between conduction and non-conduction between the capacitor and the node N1 although this is not illustrated. The conduction and the non-conduction of the switch is controlled by using the single level of a timing signal that is inputted from the control unit 44.

The control unit 44 controls the timing with which the sample and hold circuit 43 holds the potential of the node N1 as the reference potential. The control unit 44 is a level shifter that adjusts the signal level of a signal that is inputted by using a timing input terminal 21. The signal that is inputted by using the timing input terminal 21 represents the timing with which the potential of the node N1 is held, that is, the timing with which the potential of the node N1 is acquired as the reference potential. In the case where the signal is inputted, the control unit 44 changes the signal level of the timing signal that is supplied to the sample and hold circuit 43 from a low level to a high level (or from the high level to the low level). Consequently, the switch of the sample and hold circuit 43 becomes conductive, and the capacitor holds the potential of the node N1.

The operational amplifier 45 is an example of a first operational amplifier and includes a non-inverting input terminal (+), an inverting input terminal (−), and an output terminal. The non-inverting input terminal is an example of a first input terminal and is connected to the node N1 with the sample and hold circuit 43 interposed therebetween. The inverting input terminal is an example of a second input terminal and is connected to the node N1. The output terminal is an example of a first output terminal and is connected to the node N1. For example, the inverting input terminal and the output terminal are directly connected to the node N1.

The operational amplifier 45 operates as an error amplifier. That is, the operational amplifier 45 outputs, as the second current Ib2 from the output terminal, a current that has an intensity that depends on a difference between a potential that is applied to the non-inverting input terminal and a potential that is applied to the inverting input terminal. The reference potential that is held by the sample and hold circuit 43 is applied to the non-inverting input terminal. The potential of the node N1 is applied to the inverting input terminal. The potential that is applied to the inverting input terminal is equal to the potential of the node N1 during monitoring. The operational amplifier 45 supplies, as the second current Ib2 from the output terminal to the node N1, a current that has an intensity that depends on the potential difference between the reference potential and the potential of the node N1 during monitoring.

The timing input terminal 21 is an external input terminal that is included in the current control circuit 20. The timing input terminal 21 is connected to, for example, a BBIC (Baseband Integrated Circuit) or a RFIC. The BBIC or the RFIC at least compares the radio-frequency signal and the threshold or compares the temperature of the amplifier transistor 11 and the threshold and determines the timing with which the potential of the node N1 is to be held as the reference potential. The BBIC or the RFIC outputs a signal for specifying the determined timing. The outputted signal is inputted into the control unit 44 via the timing input terminal 21.

The control unit 44 may determine the timing. For example, at least power information that represents the signal power of the radio-frequency signal or temperature information that represents the temperature of the amplifier transistor 11 may be inputted into the timing input terminal 21. The control unit 44 may include a memory that stores the thresholds and may determine the timing with which the potential of the node N1 is held as the reference potential, based on at least the power information or the temperature information.

In the case where the control unit 44 determines the timing, it is optional to provide the timing input terminal 21. For example, the control unit 44 may include a detection unit that detect at least the signal power of the radio-frequency signal or the temperature of the amplifier transistor 11 and may determine the timing with which the potential of the node N1 is held, based on at least the signal power of the radio-frequency signal or the temperature of the amplifier transistor 11 that is detected by the detection unit. For example, the control unit 44 further includes a delay circuit that is connected to the detection unit and the sample and hold circuit 43. The delay circuit generates a predetermined timing signal, based on the result of detection and inputs the generated timing signal to the sample and hold circuit 43. This enables the sample and hold circuit 43 to hold the potential of the node N1 with the timing with the potential of the node N1 is to be held.

[1-4. Operation]

Next, the operation of the amplifier device 1 according to the present embodiment will be described.

The case where the signal power of the radio-frequency signal that is inputted into the power amplifier 10 is low power, and the temperature of the amplifier transistor 11 is low will now be described with reference to FIG. 2 and FIG. 4.

As illustrated in FIG. 4, the current control circuit 20 outputs, as the control current Ib, the first current Ib1 that is supplied by the constant current source circuit 30 from the node N1. As illustrated in FIG. 2, the control current Ib is inputted into the bias circuit 12 from the node N1 of the current control circuit 20 via the control input terminal 13.

As for the bias circuit 12, the transistor Tr1 and the transistor Tr2 form the current mirror circuit, and accordingly, a current that depends on the control current Ib flows from the power terminal 14 via the transistor Tr2 and is supplied as the bias current Ibpa to the base of the amplifier transistor 11. In the case where the signal power of the radio-frequency signal that is inputted into the power amplifier 10 is low power, and the temperature of the amplifier transistor 11 is low, the amplifier transistor 11 stably operates due to the bias current Ibpa, and accordingly, the radio-frequency signal can be appropriately amplified. At this time, the gain of the amplifier transistor 11 is stable.

Next, the case where the signal power of the radio-frequency signal that is inputted into the power amplifier 10 is high power will be described.

In the case where the signal power of the radio-frequency signal that is inputted into the amplifier transistor 11 is high power, the average potential of the base of the amplifier transistor 11 per time increases, and accordingly, the emitter potential of the transistor Tr2 increases. The increase in the emitter potential decreases the voltage between the base and the emitter of the transistor Tr2, and accordingly, the current mirror circuit that is formed by the transistors Tr1 and Tr2 cannot perform an ideal current mirror operation. For this reason, the bias current Ibpa that is the collector current of the transistor Tr2 starts decreasing.

A part of the control current Ib that flows into the base of the transistor Tr2 increases to inhibit the bias current Ibpa from decreasing. For this reason, a part of the control current Ib that flows through the transistors Tr1 and Tr3 decreases. The decrease in the current that flows through the transistors Tr1 and Tr3 decreases a voltage drop at the transistors Tr1 and Tr3, and accordingly, the collector potential of the transistor Tr1 decreases. The collector potential of the transistor Tr1 is equal to the base potential of the transistor Tr2. Accordingly, the base potential decreases, the voltage between the base and the emitter of the transistor Tr2 consequently decreases, and the bias current Ibpa cannot be maintained after all. Accordingly, a decrease in the bias current Ibpa decreases the gain of the amplifier transistor 11.

Figure 5:
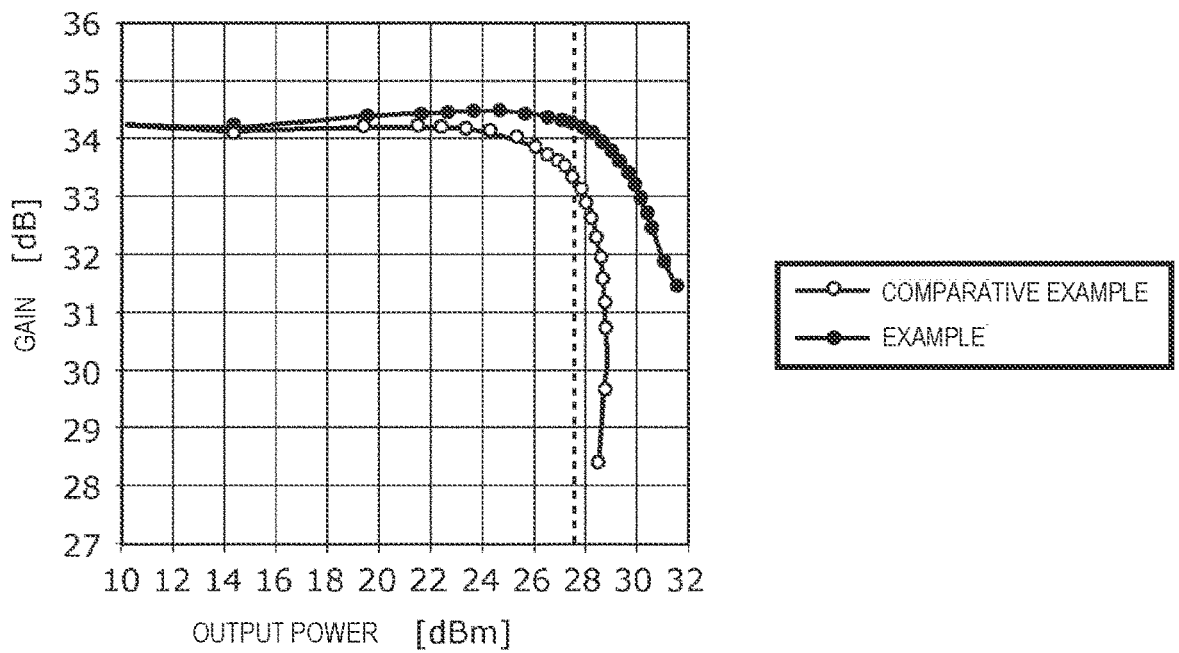
FIG. 5 illustrates output power characteristics (input power characteristics) of the gain of the amplifier transistor according to the first embodiment.

FIG. 5 illustrates output power characteristics (input power characteristics) of the gain of the amplifier transistor 11 according to the present embodiment. In FIG. 5, the vertical axis represents the gain of the amplifier transistor 11. The horizontal axis represents the signal power (output power) of the radio-frequency signal that is outputted from the output terminal Pout of the power amplifier 10. The horizontal axis can be replaced with the signal power (input power) of the radio-frequency signal that is inputted into the input terminal Pin of the power amplifier 10.

FIG. 5 illustrates the output power characteristics of the gain of the amplifier transistor 11 in the case where the current control circuit 20 does not include the variable current source circuit 40, and a constant current is supplied as the control current Ib, which corresponds to a comparative example. In the example illustrated in FIG. 5, the bias current Ibpa is set during the absence of a signal such that the bias current Ibpa that flows is suitable for an output of 27.5 dBm. In the comparative example, a decrease in the gain of the amplifier transistor 11 is seen in a range of 20 dBm or more.

In the case where the control current Ib is thus constant, the potential of the node N1 decreases when the signal power of the radio-frequency signal is high power. As a result, the bias current Ibpa cannot be maintained, and the gain of the amplifier transistor 11 decreases. That is, the gain cannot maintain linearity with respect to the input power, and output distortion increases in the case of high power.

In view of this, the current control circuit 20 according to the present embodiment includes the variable current source circuit 40. In the case where the potential of the node N1 decreases, the variable current source circuit 40 supplies the second current Ib2 to the node N1 in addition to the first current Ib1. Specifically, as illustrated in FIG. 4, the inverting input terminal of the operational amplifier 45 is connected to the node N1, and accordingly, a decrease in the potential of the node N1 increases the potential difference between the non-inverting input terminal and the inverting input terminal. The operational amplifier 45 supplies, as the second current Ib2 from the output terminal to the node N1, a current that depends on the magnitude of the potential difference. Consequently, the current including the first current Ib1 and the second current Ib2 is outputted as the control current Ib from the node N1.

An increase in the control current Ib enables the amount of the current that flows through the transistors Tr1 and Tr3 to be maintained while the current that is supplied to the base of the transistor Tr2 of the bias circuit 12 is increased. For this reason, the degree of the voltage drop at the transistors Tr1 and Tr3 can be maintained, and the collector potential of the transistor Tr1, that is, the base potential of the transistor Tr2 can be maintained. Accordingly, the bias current Ibpa can be maintained, and the gain of the amplifier transistor 11 can be consequently maintained. For example, as illustrated by an example in FIG. 5, it is confirmed that the gain of the amplifier transistor 11 can be maintained at about 27.5 dBm.

The case where the temperature of the amplifier transistor 11 increases demonstrates the same as the case where the input power is high power.

For example, in the case where the radio-frequency signal is continuously inputted into the amplifier transistor 11, the power amplifier 10 consumes power and consequently generates heat, and the temperature thereof increases. The increase in the temperature of the amplifier transistor 11 decreases the voltage between the base and the emitter of the amplifier transistor 11 and decreases the gain. For this reason, the gain of the amplifier transistor 11 cannot be maintained merely by supplying the constant bias current Ibpa to the base of the amplifier transistor 11.

The increase in the temperature of the power amplifier 10 decreases the voltage between the base and the emitter of each of the transistors Tr1, Tr2, and Tr3. In the case where the control current Ib is a constant current (only the first current Ib1), it is optional to increase the current that flows into the base of the transistor Tr2 in order to increase the bias current Ibpa. For this reason, the potential of the node N1 decreases as in the case where the input power is high power.

Accordingly, as for the current control circuit 20 according to the present embodiment, the decrease in the potential of the node N1 is detected, and the second current Ib2 is consequently supplied to the node N1. For this reason, the control current Ib can be increased, the bias current Ibpa can be increased, and the gain of the amplifier transistor 11 can be inhibited from decreasing.

[1-5. Effects and Others]

As described above, the current control circuit 20 according to the present embodiment is a current control circuit for controlling the bias current that is supplied to the amplifier transistor 11 that amplifies the radio-frequency signal and includes the node N1, the constant current source circuit 30 that supplies the first current Ib1 to the node N1, and the variable current source circuit 40 that supplies the second current Ib2 to the node N1, based on the result of comparison between the potential of the node N1 and the reference potential. The node N1 outputs the control current Ib including the first current Ib1 and the second current Ib2 for controlling the bias current Ibpa.

Consequently, the second current Ib2 is additionally outputted from the node N1, based on the result of comparison between the potential of the node N1 and the reference potential. The amount of the control current Ib is adjusted, and the amount of the bias current Ibpa that is supplied to the amplifier transistor 11 can be consequently adjusted. For example, the bias current Ibpa can be inhibited from decreasing, and accordingly, distortion characteristics of the amplifier transistor 11 can be inhibited from being degraded.

For example, the reference potential is equal to the potential of the node N1 in the case where the signal intensity of the radio-frequency signal is the threshold or less.

This enables the bias current Ibpa to be maintained and inhibits the gain of the amplifier transistor 11 from decreasing even in the case where the signal power of the radio-frequency signal that is inputted into the amplifier transistor 11 is high. For this reason, the output distortion in the case of high power can be reduced, and accordingly, the distortion characteristics of the amplifier transistor 11 can be inhibited from being degraded.

For example, the reference potential may be equal to the potential of the node N1 in the case where the temperature of the amplifier transistor 11 is the threshold or less.

This enables the bias current Ibpa to be increased and inhibits the gain of the amplifier transistor 11 from decreasing even in the case where the temperature of the amplifier transistor 11 increases. For this reason, the output distortion at a high temperature can be reduced, and accordingly, the distortion characteristics of the amplifier transistor 11 can be inhibited from being degraded.

The variable current source circuit 40, for example, includes the sample and hold circuit 43 that holds the potential of the node N1 with the predetermined timing as the reference potential and the operational amplifier 45 that includes the non-inverting input terminal, the inverting input terminal, and the output terminal. The non-inverting input terminal of the operational amplifier 45 is connected to the node N1 with the sample and hold circuit 43 interposed therebetween. The inverting input terminal and the output terminal of the operational amplifier 45 are connected to the node N1.

This enables the sample and hold circuit 43 to hold, as the reference potential, the potential of the node N1 in a normal operation, for example, during a low power signal input or a low temperature. The operational amplifier 45 can supply the second current Ib2 based on the potential difference between the potential of the node N1 and the reference potential. In this way, the distortion characteristics can be inhibited from being degraded with a simple circuit structure.

The variable current source circuit 40, for example, further includes the control unit 44 that controls the timing with which the sample and hold circuit 43 holds the potential of the node N1 as the reference potential.

This enables the potential of the node N1 to be held as the reference potential with the appropriate timing. The precision of the reference potential to be compared with that of the node N1 can be increased, and accordingly, the appropriate control current Ib can be supplied to the bias circuit 12 depending on situations. Accordingly, the distortion characteristics of the amplifier transistor 11 can be appropriately inhibited from being degraded.

The constant current source circuit 30, for example, includes the constant current source 33, the first current mirror circuit that includes the transistors 31 and 32 that include the respective control terminals connected to each other. The first input-output terminal and the control terminal of the transistor 32 are connected to the constant current source 33. The first input-output terminal of the transistor 31 is connected to the node N1. The second input-output terminal of the transistor 31 and the second input-output terminal of the transistor 32 are connected to the voltage source Vbatt.

This enables a small current source such as a current output DAC to be used as the constant current source, and accordingly, the current control circuit 20 can have low power consumption, and the degree of freedom of the arrangement of the circuit structure thereof can be high.

The operational amplifier 45, for example, supplies, as the second current Ib2 to the node N1 from the output terminal, a current that has an intensity that depends on the difference between the potential that is applied to the non-inverting input terminal and the potential that is applied to the inverting input terminal.

This enables the distortion characteristics to be appropriately inhibited from being degraded with a simple structure that uses the operational amplifier 45.

The variable current source circuit 40, for example, increases the second current Ib2 in the case where the potential of the node N1 decreases and decreases the second current Ib2 in the case where the potential of the node N1 increases.

This enables the appropriate second current Ib2 depending on the potential of the node N1 to be supplied and accordingly more appropriately inhibits the distortion characteristics from being degraded.

The bias supply circuit according to the present embodiment includes the current control circuit 20 and the bias circuit 12 that is connected to the node N1 and that supplies the bias current Ibpa to the amplifier transistor 11. The bias circuit 12 includes the second current mirror circuit that includes the transistors Tr1 and Tr2 that include the respective control terminals connected to each other. The first input-output terminal and the control terminal of the transistor Tr1 are connected to the node N1. The first input-output terminal of the transistor Tr2 is connected to the control terminal of the amplifier transistor 11.

This enables effects that are the same as those of the current control circuit 20 described above to be acquired.

The bias circuit 12, for example, further includes the transistor Tr3 that is diode-connected between the second input-output terminal of the transistor Tr1 and the standard potential.

Consequently, the bias current Ibpa is adjusted depending on the intensity of the control current Ib, and accordingly, the distortion characteristics can be more appropriately inhibited from being degraded.

The amplifier device 1 according to the present embodiment includes the bias supply circuit described above and the amplifier transistor 11.

This enables effects that are the same as those of the current control circuit 20 described above to be acquired.

[1-6. Modification]

Figure 6:
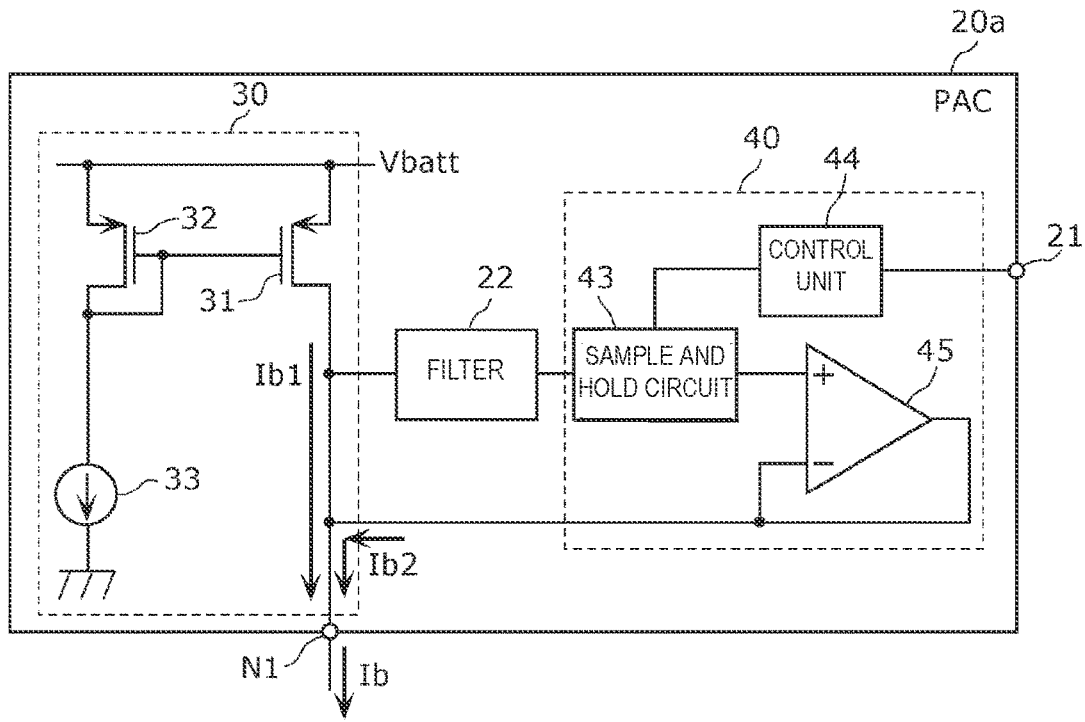
FIG. 6 is a circuit diagram illustrating the circuit structure of the current control circuit according to a modification to the first embodiment.

A modification to the current control circuit 20 according to the present embodiment will now be described with reference to FIG. 6. FIG. 6 is a circuit diagram illustrating the circuit structure of a current control circuit 20a according to the modification to the present embodiment.

As illustrated in FIG. 6, the current control circuit 20a differs from the current control circuit 20 according to the first embodiment in including a filter 22. The filter 22 is connected between the node N1 and the sample and hold circuit 43. The filter 22 has a frequency band including the signal frequency of the radio-frequency signal as a cutoff frequency band. Specifically, the filter 22 is a low pass filter or a band pass filter.

The current control circuit 20a according to the modification thus includes the filter 22 that is connected between the node N1 and the sample and hold circuit 43 and that has the frequency band including the signal frequency of the radio-frequency signal as the cutoff frequency band.

This inhibits radio frequency components from being inputted into the sample and hold circuit 43, and accordingly, the sample and hold circuit 43 can stably hold direct current components of the potential of the node N1. For this reason, the precision of the reference potential can be increased, and the distortion characteristics can be inhibited from being degraded.

Second Embodiment

Next, a second embodiment will be described. The second embodiment differs from the first embodiment in including a current control circuit that has a different structure. Differences from the first embodiment will be mainly described below, and a common description is omitted or simplified.

[2-1. Structure of Current Control Circuit]

The structure of the current control circuit according to the present embodiment will be described below. According to the present embodiment, the structure of the power amplifier 10 to which the node N1 of the current control circuit is connected is the same as that according to the first embodiment.

[2-1-1. Functional Configuration]

Figure 7:
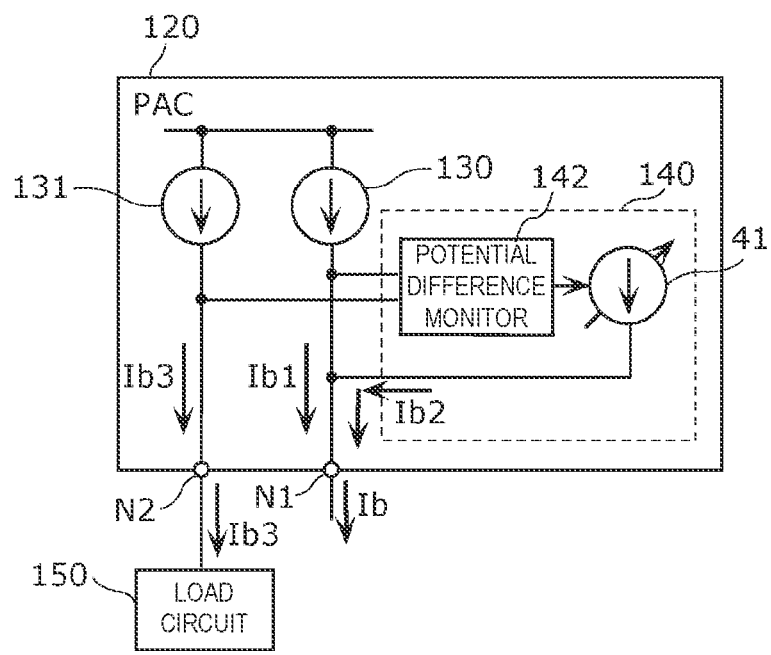
FIG. 7 illustrates the functional configuration of a current control circuit according to a second embodiment.

The functional configuration of the current control circuit according to the present embodiment will now be described with reference to FIG. 7. FIG. 7 illustrates the functional configuration of a current control circuit 120 according to the present embodiment.

As illustrated in FIG. 7, the current control circuit 120 includes the node N1, a node N2, constant current source circuits 130 and 131, and a variable current source circuit 140.

The node N1 is the same as that according to the first embodiment and is connected to the control input terminal 13 (see FIG. 2) of the bias circuit 12 of the power amplifier 10.

The node N2 is an example of a second node and is connected to a load circuit 150. The node N2 is located on a path that connects the constant current source circuit 131 and the load circuit 150 to each other.

The constant current source circuit 130 is an example of the first constant current source circuit and supplies the first current Ib1 to the node N1. The first current Ib1 is a constant current.

The constant current source circuit 131 is an example of a second constant current source circuit and supplies a third current Ib3 to the node N2. The constant current source circuit 131 supplies the third current Ib3 to the load circuit 150 via the node N2. The third current Ib3 is a constant current. Specifically, the third current Ib3 has the same intensity as the first current Ib1.

The variable current source circuit 140 supplies the second current Ib2 to the node N1, based on the result of comparison between the potential of the node N1 and the reference potential. According to the present embodiment, the reference potential is equal to the potential of the node N2.

As illustrated in FIG. 7, the function of the variable current source circuit 140 includes those of the variable current source 41 and a potential difference monitor 142. The variable current source 41 is the same as that according to the first embodiment.

The potential difference monitor 142 monitors a potential difference between the potential of the node N1 and the potential of the node N2. That is, the potential difference monitor 142 compares the potential of the node N1 and the potential of the node N2 that corresponds to the reference potential. The operation of the variable current source circuit 140 is the same as that of the variable current source circuit 40 according to the first embodiment except that the reference potential is equal to the potential of the node N2.

[2-1-2. Circuit Structure]

Figure 8:
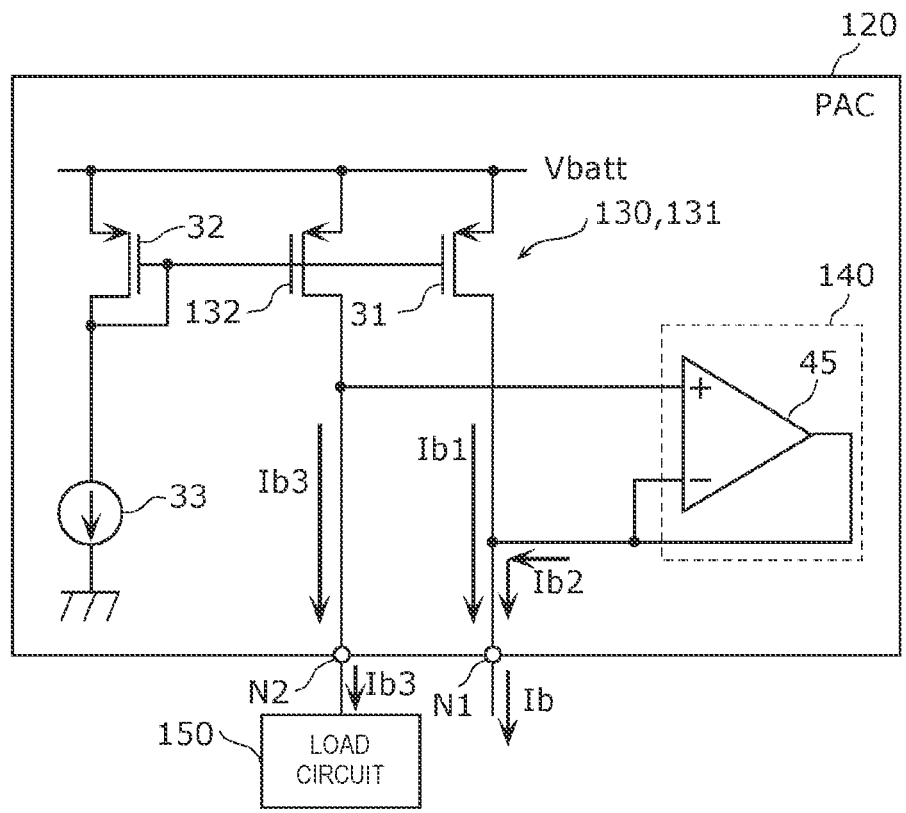
FIG. 8 is a circuit diagram illustrating the circuit structure of the current control circuit according to the second embodiment.

Next, a specific circuit structure of the current control circuit 120 will be described with reference to FIG. 8. FIG. 8 is a circuit diagram illustrating the circuit structure of the current control circuit 120 according to the present embodiment.

[2-1-2-1. Constant Current Source Circuit]

As illustrated in FIG. 8, the constant current source circuits 130 and 131 include the transistors 31 and 32, a transistor 132, and the constant current source 33. Specifically, the constant current source circuit 130 includes the transistors 31 and 32 and the constant current source 33. The constant current source circuit 131 includes the transistors 32 and 132 and the constant current source 33. That is, the transistor 32 and the constant current source 33 serve parts of the functions of the constant current source circuits 130 and 131.

The constant current source circuit 130 has the same structure as the constant current source circuit 30 according to the first embodiment. That is, the transistors 31 and 32 and the constant current source 33 are the same as those according to the first embodiment.

The constant current source circuit 131 has a structure equivalent to that of the constant current source circuit 130. Specifically, as for the constant current source circuit 131, the transistors 32 and 132 include respective control terminals connected to each other and form a current mirror circuit. The current mirror circuit is connected to the constant current source 33 and the node N2.

The kind of transistor 132 is the same as the kind of the transistor 32. Specifically, the transistor 132 is a field-effect transistor and includes a gate, a drain, and a source. The gate is an example of the control terminal. The drain and the source are examples of the input-output terminal. An example of the transistor 132 is a p-channel MOSFET that is formed by using Si.

The transistor 132 is an example of a third transistor. The source of the transistor 132 is connected to the voltage source Vbatt, and the drain thereof is connected to the node N2. The gate of the transistor 132 is connected to the constant current source 33.

For example, the transistor 132 has the same characteristics as the transistor 31. This enables the third current Ib3 that flows through the transistor 132 to be the same as the first current Ib1 that flows through the transistor 31.

[2-1-2-2. Variable Current Source Circuit]

As illustrated in FIG. 8, the variable current source circuit 140 includes the operational amplifier 45. That is, the operational amplifier 45 serves the functions of the variable current source 41 and the potential difference monitor 142.

The non-inverting input terminal of the operational amplifier 45 is connected to the node N2. The inverting input terminal and the output terminal of the operational amplifier 45 are connected to the node N1. According to the present embodiment, each terminal of the operational amplifier 45 is directly connected to the node N1 or N2. Consequently, the potential of the node N2 is applied as the reference potential to the non-inverting input terminal. The potential of the node N1 is applied to the inverting input terminal. The operational amplifier 45 supplies, as the second current Ib2 to the node N1 from the output terminal, a current that depends on the potential difference between the reference potential and the potential of the node N1 during monitoring.

[2-2. Load Circuit]

As illustrated in FIG. 8, the load circuit 150 is connected to the node N2. An amplifier device according to the present embodiment includes the load circuit 150. The load circuit 150 has a circuit structure equivalent to that of the power amplifier 10.

Figure 9:
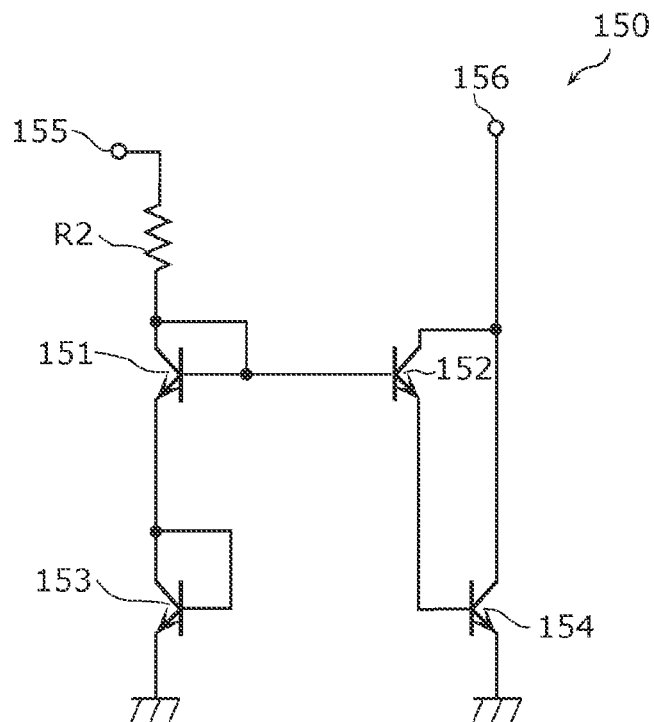
FIG. 9 is a circuit diagram illustrating the circuit structure of a load circuit that is connected to the current control circuit according to the second embodiment.

FIG. 9 is a circuit diagram illustrating the circuit structure of the load circuit 150 according to the present embodiment. As illustrated in FIG. 9, the load circuit 150 includes transistors 151 to 154 and a resistor R2. The load circuit 150 includes a current input terminal 155 and a power terminal 156. The current input terminal 155 is connected to the node N2 of the current control circuit 120.

The transistors 151 to 154 correspond to the respective transistors Tr1 to Tr3 and the amplifier transistor 11 of the power amplifier 10. A relationship in connection among the transistors 151 to 154 is the same as a relationship in connection among the transistors Tr1 to Tr3 and the amplifier transistor 11.

For example, the transistors 151 and 152 include respective control terminals connected to each other and form a current mirror circuit. The current mirror circuit is an example of a third current mirror circuit and is connected to the transistor 154. The kinds of the transistors 151 and 152 are the same and are the same as the kinds of the transistors Tr1 and Tr2 of the bias circuit 12. Examples of the transistors 151 and 152 include a npn bipolar transistor that is formed by using Si, SiGe, or GaAs.

The transistor 151 is an example of a seventh transistor. The collector and the base of the transistor 151 are connected to each other and are connected to the current input terminal 155 with the resistor R2 interposed therebetween. That is, the collector and the base of the transistor 151 are connected to the node N2 of the current control circuit 120. The emitter of the transistor 151 is connected to the ground with the transistor 153 interposed therebetween.

The transistor 152 is an example of an eighth transistor. The collector of the transistor 152 is connected to the power terminal 156. The base of the transistor 152 is connected to the base of the transistor 151. The emitter of the transistor 152 is connected to the base of the transistor 154.

The kind of the transistor 153 is the same as the kind of the transistor Tr3 of the bias circuit 12. In other words, the transistor 153 is a bipolar transistor and includes a base, a collector, and an emitter. An example of the transistor 153 is a npn bipolar transistor that is formed by using Si, SiGe, or GaAs. In the case where the transistor Tr3 of the bias circuit 12 is a FET, the transistor 153 is a FET.

The transistor 153 is an example of an eleventh transistor and is diode-connected between the emitter of the transistor 151 and the standard potential. Specifically, the base and the collector of the transistor 153 are connected to each other and are connected to the emitter of the transistor 151. The emitter of the transistor 153 is connected to the ground that is an example of the standard potential.

The kind of the transistor 154 is the same as the kind of the amplifier transistor 11 of the bias circuit 12. The transistor 154 is a bipolar transistor and includes a base, a collector, and an emitter. An example of the transistor 154 is a npn bipolar transistor that is formed by using Si, SiGe, or GaAs.

The transistor 154 is an example of a ninth transistor. As for the transistor 154, no radio-frequency signal is inputted into the base unlike the amplifier transistor 11. That is, the base of the transistor 154 is connected to the emitter of the transistor 152 and is not connected to the input terminal Pin. The emitter of the transistor 154 is connected to the ground that is an example of the standard potential. The collector of the transistor 154 is connected to the power terminal 156.

The load circuit 150 thus includes the same kind of circuit elements as the power amplifier 10 and has a circuit structure that imitates that of the power amplifier 10. The load circuit 150 differs from the power amplifier 10 in that no radio-frequency signal is inputted. For example, the transistors 151 to 154 and the resistor R2 of the load circuit 150 may have the same characteristics (for example, the same temperature characteristics) as the transistors Tr1 to Tr3, the amplifier transistor 11, and the resistor R1 of the power amplifier 10. This enables the load circuit 150 to take the same load action as the power amplifier 10, and accordingly, the precision of the potential of the node N2, that is, the reference potential can be improved.

Alternatively, the transistors 151 to 154 and the resistor R2 of the load circuit 150 may have structures that are acquired by decreasing the scales (downsizing) of the transistors Tr1 to Tr3, the amplifier transistor 11, and the resistor R1 of the power amplifier 10. In this case, the transistor 132 that is connected to the node N2 may have a structure that is acquired by decreasing the scale of the transistor 31 that is connected to the node N1. For example, the use of an element having a size of 1/10 as each circuit element enables the third current Ib3 to be reduced and enables the power consumption to be reduced.

[2-3. Operation]

Next, the operation of the amplifier device according to the present embodiment will be described. The operation of the power amplifier 10 is the same as that according to the first embodiment, and accordingly, the operation of the current control circuit 120 will be described below.

According to the present embodiment, the load circuit 150 illustrated in FIG. 9 is connected to the node N2. No radio-frequency signal is inputted into the load circuit 150. The load circuit 150 is not thermally coupled with the power amplifier 10. For this reason, the potential of the node N2 is not affected by influences of the magnitude of the signal power of the radio-frequency signal and the temperature of the power amplifier 10 but is stable. That is, the reference potential that is equal to the potential of the node N2 is kept constant. For this reason, the operational amplifier 45 illustrated in FIG. 8 can monitor the decrease in the potential of the node N1 by comparison with the potential of the node N2.

In the case where the potential of the node N1 decreases, the variable current source circuit 140 supplies the second current Ib2 to the node N1 in addition to the first current Ib1. Specifically, as illustrated in FIG. 8, the inverting input terminal of the operational amplifier 45 is connected to the node N1, and accordingly, the decrease in the potential of the node N1 increases the potential difference between the non-inverting input terminal and the inverting input terminal. The operational amplifier 45 outputs, as the second current Ib2, a current that depends on the magnitude of the potential difference to the node N1 from the output terminal. Consequently, the current including the first current Ib1 and the second current Ib2 is outputted as the control current Ib from the node N1. Accordingly, the bias current Ibpa that is supplied to the amplifier transistor 11 can be maintained, and the gain of the amplifier transistor 11 can be maintained as in the first embodiment. As illustrated by the example in FIG. 5, it is confirmed that the gain of the amplifier transistor 11 can be maintained at about 27.5 dBm also as for the current control circuit 120 according to the present embodiment. The gain of the amplifier transistor 11 can be maintained not only in the case where the signal power of the radio-frequency signal is high power but also in the case where the temperature of the power amplifier 10 increases.

[2-4. Effects and Others]

As described above, the current control circuit 120 according to the present embodiment includes the node N1, the constant current source circuit 130, the variable current source circuit 140, the node N2 to which the load circuit 150 is connected, and the constant current source circuit 131 that supplies the third current Ib3 to the load circuit 150 via the node N2. The reference potential is equal to the potential of the second node N2.

This eliminates the necessity of management of the timing with which the potential of the node N1 is held and enables the variable current source circuit 140 to be readily controlled. The use of the potential of the node N2 on a path that differs from the path to which the node N1 is connected as the reference potential enables the influence of the radio-frequency signal to be reduced and enables the reference potential to be stable. This enables the operation of the variable current source circuit 140 to be stable. Accordingly, the distortion characteristics of the amplifier transistor 11 can be appropriately inhibited from being degraded.

The variable current source circuit 140, for example, includes the operational amplifier 45 that includes the non-inverting input terminal, the inverting input terminal, and the output terminal. The non-inverting input terminal is connected to the node N2. The inverting input terminal and the output terminal are connected to the node N1.

This enables the second current Ib2 to be supplied based on the potential difference between the potential of the node N1 and the potential of the node N2. In this way, the distortion characteristics can be inhibited from being degraded with a simple circuit structure.

The constant current source circuit 130, for example, includes the transistor 31. The constant current source circuit 131 includes the constant current source 33 and the transistor 32. The transistors 31 and 32 include the respective control terminals connected to each other and form the current mirror circuit. The first input-output terminal of the transistor 31 is connected to the node N1. The first input-output terminal and the control terminal of the transistor 32 are connected to the constant current source 33. The second input-output terminal of the transistor 31 and the second input-output terminal of the transistor 32 are connected to the voltage source Vbatt.

This enables a small current source such as a current output DAC to be used as the constant current source, and accordingly, the current control circuit can have low power consumption, and the degree of freedom of the arrangement of the circuit structure thereof can be high.

The constant current source circuit 131, for example, further includes the transistor 132. The transistors 32 and 132 include the respective control terminals connected to each other and form the current mirror circuit. The first input-output terminal of the transistor 132 is connected to the node N2. The second input-output terminal of the transistor 132 is connected to the voltage source Vbatt.

This enables the current mirror circuit to cause the current to flow into the load circuit 150 with precision and enables the potential of the node N2 that corresponds to the reference potential to be stable. Accordingly, the distortion characteristics of the amplifier transistor 11 can be appropriately inhibited from being degraded.

The bias supply circuit according to the present embodiment includes the current control circuit 120, the bias circuit 12 that is connected to the node N1 and that supplies the bias current Ibpa to the amplifier transistor 11, and the load circuit 150. The bias circuit 12 includes the second current mirror circuit that includes the transistors Tr1 and Tr2 that include the respective control terminals connected to each other. The first input-output terminal and the control terminal of the transistor Tr1 are connected to the node N1. The first input-output terminal of the transistor Tr2 is connected to the control terminal of the amplifier transistor 11. The load circuit 150 includes the third current mirror circuit that includes the transistors 151 and 152 that include the respective control terminals connected to each other and the transistor 154. The first input-output terminal and the control terminal of the transistor 151 are connected to the node N2. The first input-output terminal of the transistor 152 is connected to the control terminal of the transistor 154. The kinds of the transistors 151 and 152 are the same as the kinds of the transistors Tr1 and Tr2. The kind of the transistor 154 is the same as the kind of the amplifier transistor 11.

This enables the power that is consumed by the load circuit 150 to be reduced, for example, in a manner in which the load circuit 150 is formed with the scale of the power amplifier 10 decreased. Accordingly, the distortion characteristics of the amplifier transistor 11 can be appropriately inhibited from being degraded with low power consumption.

Third Embodiment

Next, a third embodiment will be described. The third embodiment differs from the second embodiment in that a current control circuit has a specific circuit structure that is changed. Differences from the second embodiment will be mainly described below, and a common description is omitted or simplified.

[3-1. Circuit Structures of Current Control Circuit and Load Circuit]

Figure 10:
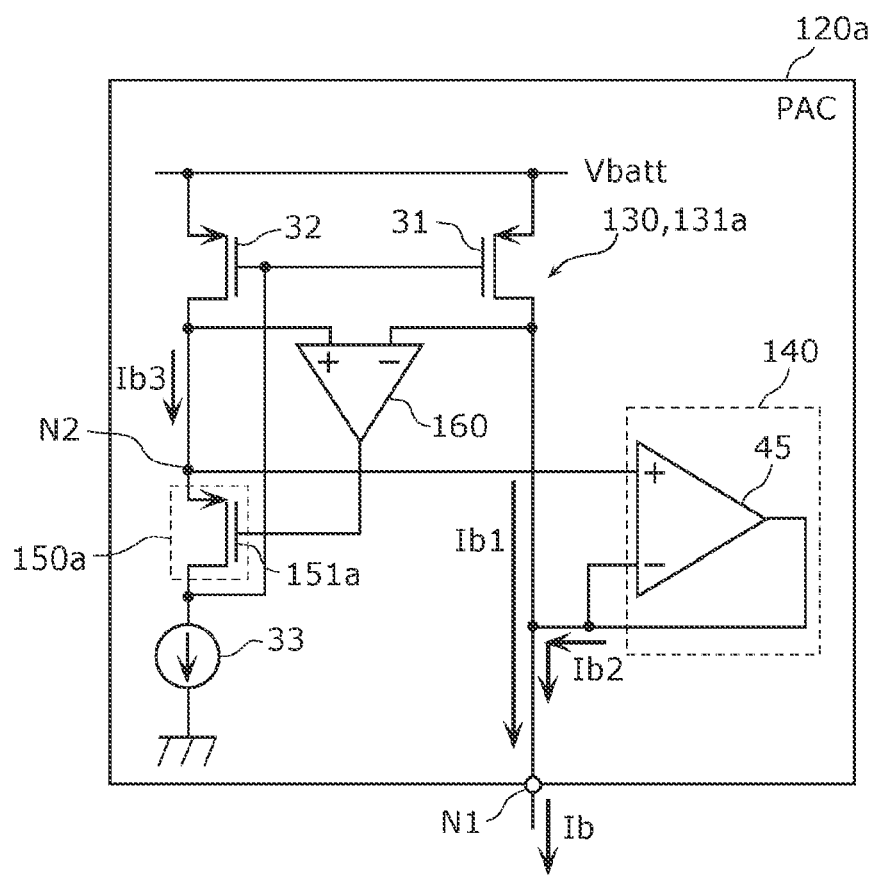
FIG. 10 is a circuit diagram illustrating the circuit structure of a current control circuit according to a third embodiment.

A specific circuit structure of the current control circuit according to the present embodiment will be described below with reference to FIG. 10. FIG. 10 is a circuit diagram illustrating the circuit structure of a current control circuit 120a according to the present embodiment. The functional configuration of the current control circuit 120a corresponds to a configuration that includes those of the current control circuit 120 and the load circuit 150 illustrated in FIG. 7.

Specifically, as illustrated in FIG. 10, the current control circuit 120a includes the constant current source circuit 130, a constant current source circuit 131a, the variable current source circuit 140, a load circuit 150a, and an operational amplifier 160.

The constant current source circuits 130 and 131a include the transistors 31 and 32 and the constant current source 33. Specifically, the constant current source circuit 130 includes the transistors 31 and 32 and the constant current source 33. The constant current source circuit 131a includes the transistor 32 and the constant current source 33. That is, the transistor 32 and the constant current source 33 serve at least parts of the functions of the constant current source circuits 130 and 131a.

The constant current source circuit 130 according to the present embodiment is the same as the constant current source circuit 130 according to the second embodiment.

As for the constant current source circuit 131a, the load circuit 150a is connected between the drain of the transistor 32 and the constant current source 33. That is, according to the present embodiment, the node N2 corresponds to an internal terminal that is located on a path that connects the drain of the transistor 32 and the load circuit 150a to each other and does not correspond to the output terminal of the constant current source circuit 131a. The gate of the transistor 32 is directly connected to the constant current source 33. The gate of the transistor 32 is connected to the drain of the transistor 32 with the load circuit 150a interposed therebetween.

The load circuit 150a includes a transistor 151a. The transistor 151a is an example of a fourth transistor. The transistor 151a is a field-effect transistor and includes a gate, a drain, and a source. The gate is an example of the control terminal. The drain and the source are examples of the input-output terminal. An example of the transistor 151a is a p-channel MOSFET that is formed by using Si.

The source of the transistor 151a is connected to the node N2. The drain of the transistor 151a is connected to the constant current source 33. The gate of the transistor 151a is connected to the output terminal of the operational amplifier 160. As for the transistor 151a, an on-resistance is changed depending on the output voltage of the operational amplifier 160, and the potential of the node N2 is consequently stabilized.

The operational amplifier 160 is an example of a second operational amplifier and includes a non-inverting input terminal (+), an inverting input terminal (−), and an output terminal. The non-inverting input terminal is an example of a third input terminal and is connected to the node N2. The inverting input terminal is an example of a fourth input terminal and is connected to the node N1. The output terminal is an example of a second output terminal and is connected to the gate of the transistor 151a.

The operational amplifier 160 operates as an error amplifier. That is, the operational amplifier 160 outputs, from the output terminal, a voltage that has an intensity that depends on a difference between a potential that is applied to the non-inverting input terminal and a potential that is applied to the inverting input terminal. The potential of the node N2 is applied to the non-inverting input terminal. The potential of the node N1 is applied to the inverting input terminal. Accordingly, the operational amplifier 45 supplies, from the output terminal to the gate of the transistor 151a, a voltage that depends on the potential difference between the potential of the node N2 and the potential of the node N1 during monitoring.

[3-2. Operation]

Next, the operation of an amplifier device according to the present embodiment will be described. The operation of the power amplifier 10 is the same as that according to second embodiment, and accordingly, the operation of the current control circuit 120a will be described below.

According to the present embodiment, as illustrated in FIG. 10, the transistor 151a is connected to the node N2. The output terminal of the operational amplifier 160 that outputs a voltage that depends on the potential difference between the node N1 and the node N2 is connected to the gate of the transistor 151a.

The operational amplifier 160 adjusts the potential of the node N2 and the potential of the node N1 such that the potentials are equal to each other due to an imaginary short-circuit action. That is, the operational amplifier 160 supplies the output voltage to the gate of the transistor 151a from the output terminal such that the potential difference between the potential of the node N1 and the potential of the node N2 becomes 0 V. The potential of the node N1 and the potential of the node N2 are equal to each other, and the current mirror precision of the transistors 31 and 32 that have different loads can be consequently improved.

In the case where the potential of the node N1 decreases, the operational amplifier 45 supplies, as the second current Ib2 to the node N1 from the output terminal, a current that depends on the magnitude of the potential difference between the node N1 and the node N2 as in the second embodiment. Consequently, the current including the first current Ib1 and the second current Ib2 is outputted as the control current Ib from the node N1. Accordingly, the amplifier transistor 11 can maintain the bias current Ibpa that is supplied, and the gain of the amplifier transistor 11 can be maintained as in the first embodiment. As illustrated by the example in FIG. 5, it is confirmed that the gain of the amplifier transistor 11 can be maintained at about 27.5 dBm also as for the current control circuit 120a according to the present embodiment. The gain of the amplifier transistor 11 can be maintained not only in the case where the signal power of the radio-frequency signal is high power but also in the case where the temperature of the power amplifier 10 increases.

[3-3. Effects and Others]

As described above, the current control circuit 120a according to the present embodiment includes the load circuit 150a and the operational amplifier 160 that includes the non-inverting input terminal, the inverting input terminal, and the output terminal. The non-inverting input terminal of the operational amplifier 160 is connected to the node N2. The inverting input terminal of the operational amplifier 160 is connected to the node N1. The load circuit 150a includes the transistor 151a that is connected between the node N2 and the constant current source 33. The first input-output terminal of the transistor 32 is connected to the constant current source 33 with the transistor 151a interposed therebetween. The output terminal of the operational amplifier 160 is connected to the control terminal of the transistor 151a.

Consequently, the use of the operational amplifier 160 enables the potential of the node N1 and the potential of the node N2 to be regarded as being equal to each other due to the imaginary short-circuit action of the operational amplifier 160 and enables the first current Ib1 to be supplied with high precision. The operational amplifier 160 is included in the current control circuit 120a, and a direct voltage is stable. Accordingly, the second current Ib2 can be supplied to the node N1 depending on a change in the node N1 in a manner in which the node N2 that has a potential that is the same as the potential of the node N1 is connected to the non-inverting input terminal of the operational amplifier 160. For this reason, the operational amplifier 45 can supply the appropriate second current Ib2 to the node N1 depending on the change in the node N1, based on the potential difference between the node N2 and the node N1.

EXAMPLES

Multiple examples of the amplifier device according to each embodiment described above will be described below.

First Example

Figure 11:
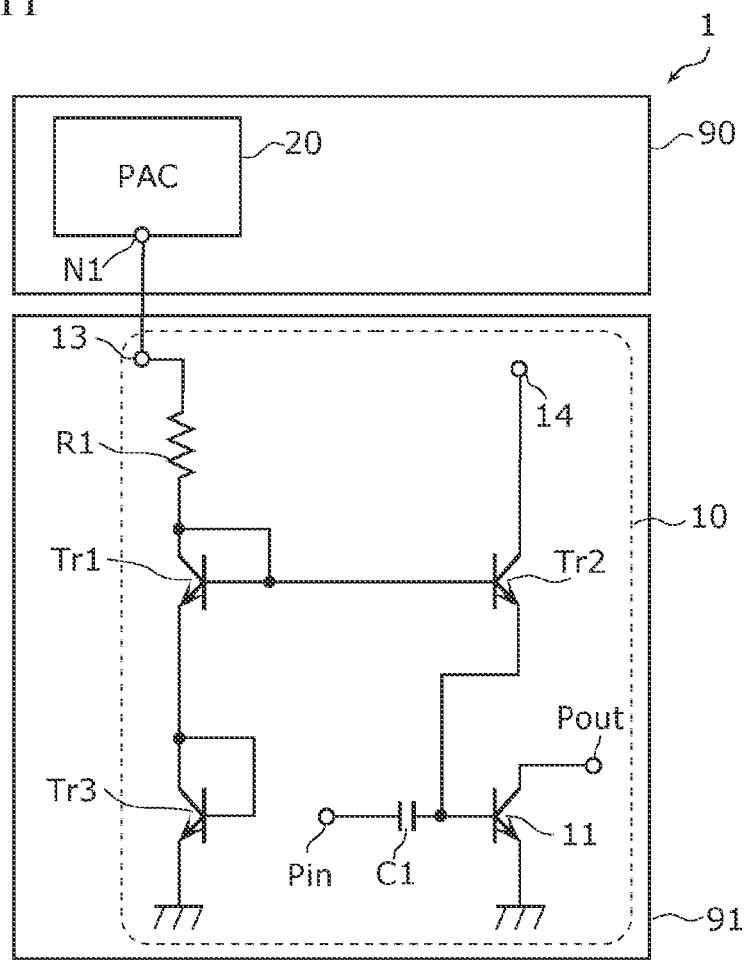
FIG. 11 illustrates a first example of the amplifier device according to each embodiment.

FIG. 11 illustrates a first example of the amplifier device according to each embodiment. As for the amplifier device 1 illustrated in FIG. 11, the current control circuit 20 is formed on a single semiconductor substrate 90, and the power amplifier 10 is formed on another semiconductor substrate 91. For example, the semiconductor substrate 90 is a Si substrate, and the semiconductor substrate 91 is a GaAs substrate. In the present example, the current mirror circuit that is formed by the transistors Tr1 and Tr2 of the bias circuit 12 and the amplifier transistor 11 are formed on the semiconductor substrate 91.

In this way, the current mirror circuit of the bias circuit 12 and the amplifier transistor 11 are formed on the semiconductor substrate 91, and the bias current Ibpa can be consequently stably supplied to the amplifier transistor 11 while the influence of disturbance is reduced.

Second Example

Figure 12:
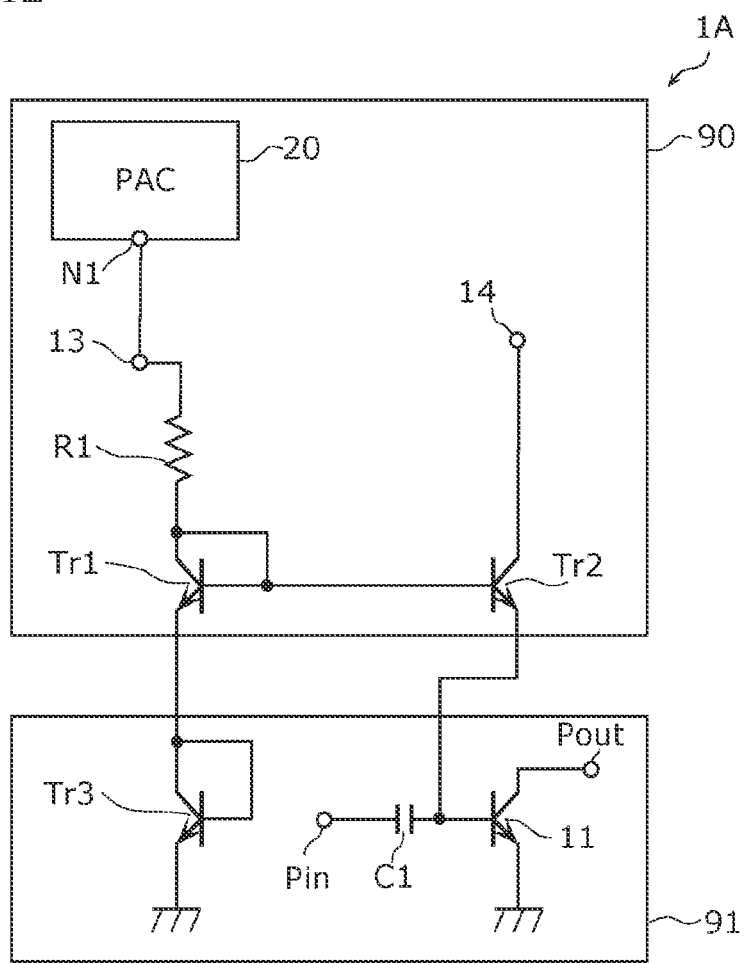
FIG. 12 illustrates a second example of the amplifier device according to each embodiment.

FIG. 12 illustrates a second example of the amplifier device according to each embodiment. As for an amplifier device 1A illustrated in FIG. 12, the current mirror circuit that is formed by the transistors Tr1 and Tr2 of the bias circuit 12 and the current control circuit 20 are formed on the semiconductor substrate 90. The transistor Tr3 and the amplifier transistor 11 are formed on the semiconductor substrate 91.

This enables thermal coupling between the current control circuit 20 and the amplifier transistor 11 and between the current mirror circuit and the amplifier transistor 11 to be reduced.

Third Example

Figure 13:
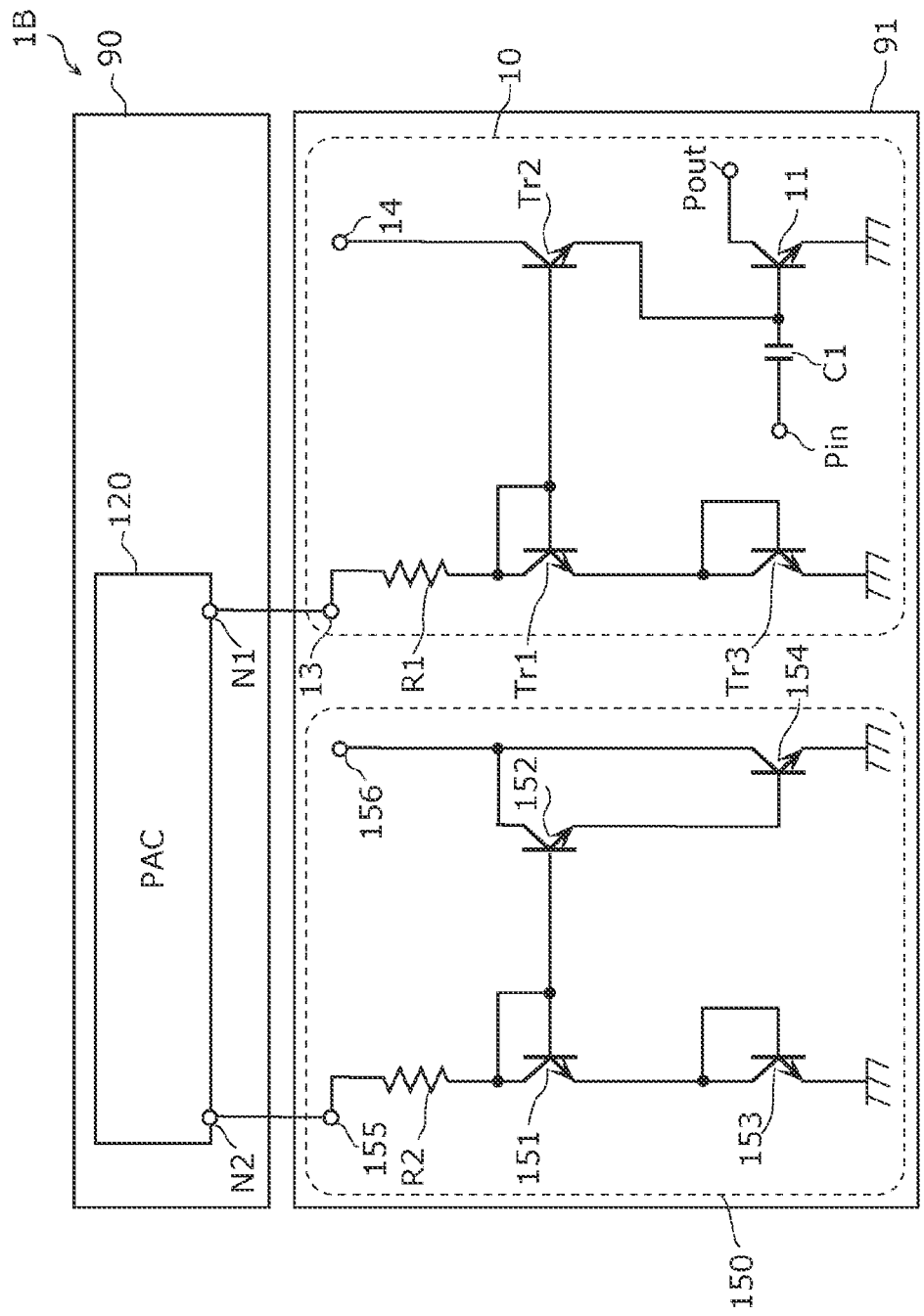
FIG. 13 illustrates a third example of the amplifier device according to the second embodiment.

FIG. 13 illustrates a third example of the amplifier device according to the second embodiment. As for an amplifier device 1B illustrated in FIG. 13, the current control circuit 120 is formed on the single semiconductor substrate 90, and the load circuit 150 and the power amplifier 10 are formed on another semiconductor substrate 91. That is, in the present example, the current mirror circuit that is formed by the transistors Tr1 and Tr2, the amplifier transistor 11, and the load circuit 150 are formed on the semiconductor substrate 91.

This readily enables threshold voltages of the transistors that are included in the load circuit 150, the transistors that form the current mirror circuit, and the amplifier transistor 11 to be equal to each other. The temperature characteristics of the transistors can be the same, and accordingly, the operation can be stabilized.

In the first and second examples, the current control circuit 20a, 120, or 120a may be formed on the semiconductor substrate 90 instead of the current control circuit 20. In the third example, the current control circuit 120, the current mirror circuit (the transistors Tr1 and Tr2) of the power amplifier 10, and the current mirror circuit (the transistors 151 and 152) of the load circuit 150 may be formed on a single semiconductor substrate. In this case, the amplifier transistor 11 and the transistors Tr3 and 153 may be formed on a single semiconductor substrate.

The current control circuit 20 and the power amplifier 10 may be formed on a single semiconductor substrate. That is, the amplifier device according to each embodiment may be formed on a corresponding one of semiconductor substrates. As for the amplifier device according to each embodiment, the circuit elements may be dispersedly disposed on three or more semiconductor substrates.

(Others)

The current control circuits, the bias supply circuits, and the amplifier devices according to the present disclosure are described above based on the embodiments described above. The present disclosure, however, is not limited to the embodiments described above.

For example, the amplifier transistor 11 may be a n-channel MOSFET. In this case, the gate, the drain, and the source of the n-channel MOSFET correspond to the base, the collector, and the emitter of the npn bipolar transistor. The amplifier transistor 11 may be a pnp bipolar transistor or a p-channel MOSFET.

Similarly, each transistor that is included in the bias circuit 12, the current control circuit 20, 20a, 120, or 120a, or the load circuit 150, for example, may be a pnp or npn bipolar transistor or a p-channel or n-channel MOSFET. In this case, transistors that form a current mirror circuit are the same kind of transistors.

According to the embodiments, the current control circuit 20, 20a, 120 or 120a is used to control the bias current but is not limited thereto. For example, the current control circuit 20, 20a, 120 or 120a reduces the variation of the potential of the node N1 that serves as a current output terminal, and the current that is outputted from the node N1 can be stabilized. For this reason, the current control circuit 20, 20a, 120 or 120a may be used as a stable current supply source with the node N1 connected to a load circuit other than the power amplifier 10.

In addition, the present disclosure includes conceivable embodiments that are acquired by modifying the embodiments by a person skilled in the art and embodiments that are acquired by freely combining the components and the functions according to the embodiments without necessarily departing from the spirit of the present disclosure.

INDUSTRIAL APPLICABILITY

The present disclosure can be widely used, for example, as an amplifier device in a radio-frequency module that supports a multi-band and that is disposed at a front-end portion for communication equipment such as a cellular phone.

REFERENCE SIGNS LIST 1, 1A, 1B amplifier device
10 power amplifier
11 amplifier transistor
12 bias circuit
13 control input terminal
14, 156 power terminal
20, 20a, 120, 120a current control circuit
21 timing input terminal
22 filter
30, 130, 131, 131a constant current source circuit
31, 32, 132, 151, 151a, 152, 153, 154, Tr1, Tr2, Tr3 transistor
33 constant current source
40, 140 variable current source circuit
41 variable current source
42 potential monitor
43 sample and hold circuit
44 control unit
45, 160 operational amplifier
90, 91 semiconductor substrate
142 potential difference monitor
150, 150a load circuit
155 current input terminal
C1 capacitor for DC cutting
Ib control current
Ib1 first current
Ib2 second current
Ib3 third current
Ibpa bias current
N1, N2 node
Pin input terminal
Pout output terminal
R1, R2 resistor

The invention claimed is:

1. A current control circuit for controlling a bias current that is supplied to an amplifier transistor that amplifies a radio-frequency signal, the current control circuit comprising:
a first node;
a first constant current source circuit configured to supply a first current to the first node; and a variable current source circuit configured to supply a second current to the first node, based on a result of a comparison between a potential of the first node and a reference potential, wherein a control current including the first current and the second current for controlling the bias current are output from the first node.

2. The current control circuit according to claim 1, wherein the reference potential is equal to the potential of the first node when a signal intensity of the radio-frequency signal is less than a threshold voltage.

3. The current control circuit according to claim 1, wherein the reference potential is equal to the potential of the first node when a temperature of the amplifier transistor is less than a threshold temperature.

4. The current control circuit according to claim 1, wherein the variable current source circuit comprises:
   a sample and hold circuit configured to hold the potential of the first node at a predetermined timing as the reference potential, and
   a first operational amplifier that includes a first input terminal, a second input terminal, and a first output terminal,
   wherein the first input terminal is connected to the first node via the sample and hold circuit, and
   wherein the second input terminal and the first output terminal are connected to the first node.

5. The current control circuit according to claim 4, wherein the variable current source circuit further comprises a controller configured to control the predetermined timing with which the sample and hold circuit holds the potential of the first node as the reference potential.

6. The current control circuit according to claim 4, further comprising:
   a filter that is connected between the first node and the sample and hold circuit, and that has a frequency band including a signal frequency of the radio-frequency signal as a cutoff frequency band.

7. The current control circuit according to claim 1, wherein the first constant current source circuit comprises:
   a constant current source, and
   a first current mirror circuit that comprises a first transistor and a second transistor, a control terminal of the first transistor being connected to a control terminal of the second terminal,
   wherein a first input-output terminal and the control terminal of the second transistor are connected to the constant current source,
   wherein a first input-output terminal of the first transistor is connected to the first node, and
   wherein a second input-output terminal of the first transistor and a second input-output terminal of the second transistor are connected to a voltage source.

8. The current control circuit according to claim 1, further comprising:
   a second node to which a load circuit is connected; and
   a second constant current source circuit configured to supply a third current to the load circuit via the second node,
   wherein the reference potential is equal to a potential of the second node.

9. The current control circuit according to claim 8, wherein the variable current source circuit comprises a first operational amplifier that includes a first input terminal, a second input terminal, and a first output terminal,
   wherein the first input terminal is connected to the second node, and
   wherein the second input terminal and the first output terminal are connected to the first node.

10. The current control circuit according to claim 8, wherein the first constant current source circuit comprises a first transistor,
    wherein the second constant current source circuit comprises a constant current source and a second transistor,
    wherein a control terminal of the first transistor is connected to a control terminal of the second transistor, and the first and second transistors form a current mirror circuit,
    wherein a first input-output terminal of the first transistor is connected to the first node,
    wherein a first input-output terminal and the control terminal of the second transistor are connected to the constant current source, and
    wherein a second input-output terminal of the first transistor and a second input-output terminal of the second transistor are connected to a voltage source.

11. The current control circuit according to claim 10, wherein the second constant current source circuit further comprises a third transistor,
    wherein a control terminal of the second transistor is connected to a control terminal of the third transistor, and the second and third transistors form a current mirror circuit,
    wherein a first input-output terminal of the third transistor is connected to the second node, and
    wherein a second input-output terminal of the third transistor is connected to the voltage source.

12. The current control circuit according to claim 10, further comprising:
    the load circuit; and
    a second operational amplifier that includes a third input terminal, a fourth input terminal, and a second output terminal,
    wherein the third input terminal is connected to the second node,
    wherein the fourth input terminal is connected to the first node,
    wherein the load circuit comprises a fourth transistor that is connected between the second node and the constant current source,
    wherein the first input-output terminal of the second transistor is connected to the constant current source via the fourth transistor, and
    wherein the second output terminal is connected to a control terminal of the fourth transistor.

13. The current control circuit according to claim 4, wherein the first operational amplifier is configured to supply, as the second current to the first node from the first output terminal, a current that has an intensity that depends on a difference between a potential that is applied to the first input terminal and a potential that is applied to the second input terminal.

14. The current control circuit according to claim 1, wherein the variable current source circuit is configured to increase the second current when the potential of the first node decreases, and to decrease the second current when the potential of the first node increases.

15. A bias supply circuit comprising:
    the current control circuit according to claim 1; and
    a bias circuit that is connected to the first node and that is configured to supply the bias current to the amplifier transistor, wherein the bias circuit comprises a second current mirror circuit that comprises a fifth transistor and a sixth transistor, wherein a control terminal of the fifth transistor is connected to a control terminal of the sixth transistor, wherein a first input-output terminal and the control terminal of the fifth transistor are connected to the first node, and wherein a first input-output terminal of the sixth transistor is connected to a control terminal of the amplifier transistor.

16. A bias supply circuit comprising:

the current control circuit according to claim 8;

a bias circuit that is connected to the first node and that is configured to supply the bias current to the amplifier transistor; and the load circuit, wherein the bias circuit comprises a second current mirror circuit that comprises a fifth transistor and a sixth transistor, wherein a control terminal of the fifth transistor is connected to a control terminal of the sixth transistor, wherein a first input-output terminal and the control terminal of the fifth transistor are connected to the first node, wherein a first input-output terminal of the sixth transistor is connected to a control terminal of the amplifier transistor, wherein the load circuit comprises a third current mirror circuit that comprises a seventh transistor and an eighth transistor, wherein a control terminal of the seventh transistor is connected to a control terminal of the eighth transistor, and the control terminals of the seventh and eighth transistors are connected to a ninth transistor, wherein a first input-output terminal and the control terminal of the seventh transistor are connected to the second node, wherein a first input-output terminal of the eighth transistor is connected to a control terminal of the ninth transistor, wherein the seventh transistor and the eighth transistor are a same kind of transistor as the fifth transistor and the sixth transistor, and wherein the ninth transistor is a same kind of transistor as the amplifier transistor.

17. The bias supply circuit according to claim 15, wherein the bias circuit further comprises a tenth transistor that is diode-connected between a second input-output terminal of the fifth transistor and a standard potential.

18. An amplifier device comprising:

the bias supply circuit according to claim 15; and the amplifier transistor.

\* \* \* \* \*